US010700433B2

(12) United States Patent
 Kato

(10) Patent No.: US 10,700,433 B2
(45) Date of Patent: Jun. 30, 2020

(54) WIRELESS COMMUNICATION DEVICE AND ARTICLE INCLUDING THE SAME

(71) Applicant: Murata Manufacturing Co., Ltd., Nagaokakyo-shi, Kyoto-fu (JP)

(72) Inventor: Noboru Kato, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 26 days.

(21) Appl. No.: 16/266,292

(22) Filed: Feb. 4, 2019

(65) Prior Publication Data

US 2019/0173178 A1    Jun. 6, 2019

Related U.S. Application Data

(63) Continuation of application No. PCT/JP2017/044670, filed on Dec. 13, 2017.

(30) Foreign Application Priority Data

Dec. 13, 2016 (JP) ................... 2016-241403

(51) Int. Cl.
*H01Q 7/00* (2006.01)
*H01Q 1/22* (2006.01)
(Continued)

(52) U.S. Cl.
CPC ............. *H01Q 7/00* (2013.01); *G06K 19/077* (2013.01); *H01Q 1/22* (2013.01); *H01Q 1/2225* (2013.01);
(Continued)

(58) Field of Classification Search
CPC ........ H01Q 7/00; H01Q 1/2225; H01Q 5/364; H01Q 9/42; H01Q 1/40; H01Q 1/48; H01Q 1/22; G06K 19/077
See application file for complete search history.

(56) References Cited

U.S. PATENT DOCUMENTS

| 8,172,149 | B2 * | 5/2012 | Yamagajo | G06K 19/07749 |
| | | | | 235/492 |
| 2011/0025471 | A1 * | 2/2011 | Popugaev | H01Q 1/2208 |
| | | | | 340/10.3 |

(Continued)

FOREIGN PATENT DOCUMENTS

| WO | 2008133018 A1 | 11/2008 |
| WO | 2015159327 A1 | 10/2015 |

(Continued)

OTHER PUBLICATIONS

International Search Report issued for PCT/JP2017/044670, dated Feb. 27, 2018.

(Continued)

*Primary Examiner* — Dieu Hien T Duong
(74) *Attorney, Agent, or Firm* — Arent Fox LLP

(57) ABSTRACT

A wireless communication device is provided that includes a flat plate-shaped conductor, an RFIC element including first and second input/output terminals, a loop antenna, and a connection conductor that connects the loop antenna to the flat plate-shaped conductor. The loop antenna includes a first conductor portion disposed along the flat plate-shaped conductor and connected to the first input/output terminal, a second conductor portion disposed along the flat plate-shaped conductor and connected to the second input/output terminal, a third conductor portion extending from the first conductor portion away from the flat plate-shaped conductor, a fourth conductor portion extending from the second conductor portion away from the flat plate-shaped conductor, and a fifth conductor portion connecting the third conductor portion and the fourth conductor portion. Moreover, the connection conductor connects the second conductor portion and the flat plate-shaped conductor.

20 Claims, 12 Drawing Sheets

(51) Int. Cl.
  *H01Q 1/48*   (2006.01)
  *H01Q 1/40*   (2006.01)
  *H01Q 9/42*   (2006.01)
  *H01Q 5/364*  (2015.01)
  *G06K 19/077* (2006.01)

(52) U.S. Cl.
  CPC ............... *H01Q 1/40* (2013.01); *H01Q 1/48* (2013.01); *H01Q 5/364* (2015.01); *H01Q 9/42* (2013.01); *H01Q 1/2283* (2013.01)

(56) References Cited

U.S. PATENT DOCUMENTS

| | | |
|---|---|---|
| 2016/0336642 A1 | 11/2016 | Makimura et al. |
| 2017/0026089 A1 | 1/2017 | Kato et al. |
| 2017/0047634 A1 | 2/2017 | Kato |
| 2018/0181848 A1 | 6/2018 | Komaki |

FOREIGN PATENT DOCUMENTS

| | | |
|---|---|---|
| WO | 2015166832 A1 | 11/2015 |
| WO | 2016031311 A1 | 3/2016 |
| WO | 2016031408 A1 | 3/2016 |
| WO | 2016098379 A1 | 6/2016 |

OTHER PUBLICATIONS

Written Opinion of the International Searching Authority issued for PCT/JP2017/044670, dated Feb. 27, 2018.

* cited by examiner

WIRELESS COMMUNICATION DEVICE AND ARTICLE INCLUDING THE SAME

CROSS REFERENCE TO RELATED APPLICATIONS

The present application is a continuation of PCT/JP2017/044670 filed Dec. 13, 2017, which claims priority to Japanese Patent Application No. 2016-241403, filed Dec. 13, 2016, the entire contents of each of which are incorporated herein by reference.

TECHNICAL FIELD

The present disclosure relates to a wireless communication device configured for wireless communication even when attached to a metal surface and an article including the wireless communication device.

BACKGROUND

Wireless communication devices including an RFIC (Radio Frequency Integrated Circuit) element and an antenna are conventionally known. For example, the wireless communication device described in Patent Document 1 (identified below) includes an RFIC element and an antenna having a helical coil. Moreover, the RFIC element and a portion of the antenna are sealed and protected in a resin block.

Patent Document 1: WO 2016/031408.

However, for the wireless communication device described in Patent Document 1, the antenna is a magnetic field antenna made up of a helical coil, and therefore, if the device is disposed near a metal surface, the metal surface interferes with formation of a magnetic field. As a result, communication cannot be performed at a sufficient communication distance.

Therefore, in view of this problem with conventional designs, a wireless communication device is needed having an RFIC element and an antenna capable of achieving a sufficient communicable distance even when disposed near a metal surface.

SUMMARY OF THE INVENTION

Accordingly, a wireless communication device is disclosed herein that includes a flat plate-shaped conductor; an RFIC element including first and second input/output terminals; a loop antenna having one end connected to the first input/output terminal and the other end connected to the second input/output terminal; and a connection conductor connecting the loop antenna and the flat plate-shaped conductor. Moreover, the loop antenna includes a first conductor portion disposed along the flat plate-shaped conductor on one side of the flat plate-shaped conductor and connected to the first input/output terminal, a second conductor portion disposed along the flat plate-shaped conductor on the one side of the flat plate-shaped conductor and connected to the second input/output terminal, a third conductor portion extending from the first conductor portion in a direction away from the flat plate-shaped conductor, a fourth conductor portion extending from the second conductor portion in a direction away from the flat plate-shaped conductor, and a fifth conductor portion connecting the third conductor portion and the fourth conductor portion. Yet further, the connection conductor connects the second conductor portion of the loop antenna and the flat plate-shaped conductor.

According to another exemplary aspect of the present disclosure, an article is provided that includes a metal surface; and a wireless communication device attached to the metal surface, wherein the wireless communication device includes a flat plate-shaped conductor disposed to face the metal surface, an RFIC element including first and second input/output terminals, a loop antenna having one end connected to the first input/output terminal and the other end connected to the second input/output terminal, and a connection conductor connecting the loop antenna and the flat plate-shaped conductor. Moreover, the loop antenna includes a first conductor portion disposed along the flat plate-shaped conductor on one side of the flat plate-shaped conductor and connected to the first input/output terminal, a second conductor portion disposed along the flat plate-shaped conductor on the one side of the flat plate-shaped conductor and connected to the second input/output terminal, a third conductor portion extending from the first conductor portion in a direction away from the flat plate-shaped conductor, a fourth conductor portion extending from the second conductor portion in a direction away from the flat plate-shaped conductor, and a fifth conductor portion connecting the third conductor portion and the fourth conductor portion. In addition, the connection conductor connects the second conductor portion of the loop antenna and the flat plate-shaped conductor.

The exemplary embodiments of the present disclosure provide a wireless communication device that has an RFIC element and an antenna configured to achieve a sufficient communicable distance even when disposed near (or on) a metal surface.

DETAILED DESCRIPTION

Figure 1:
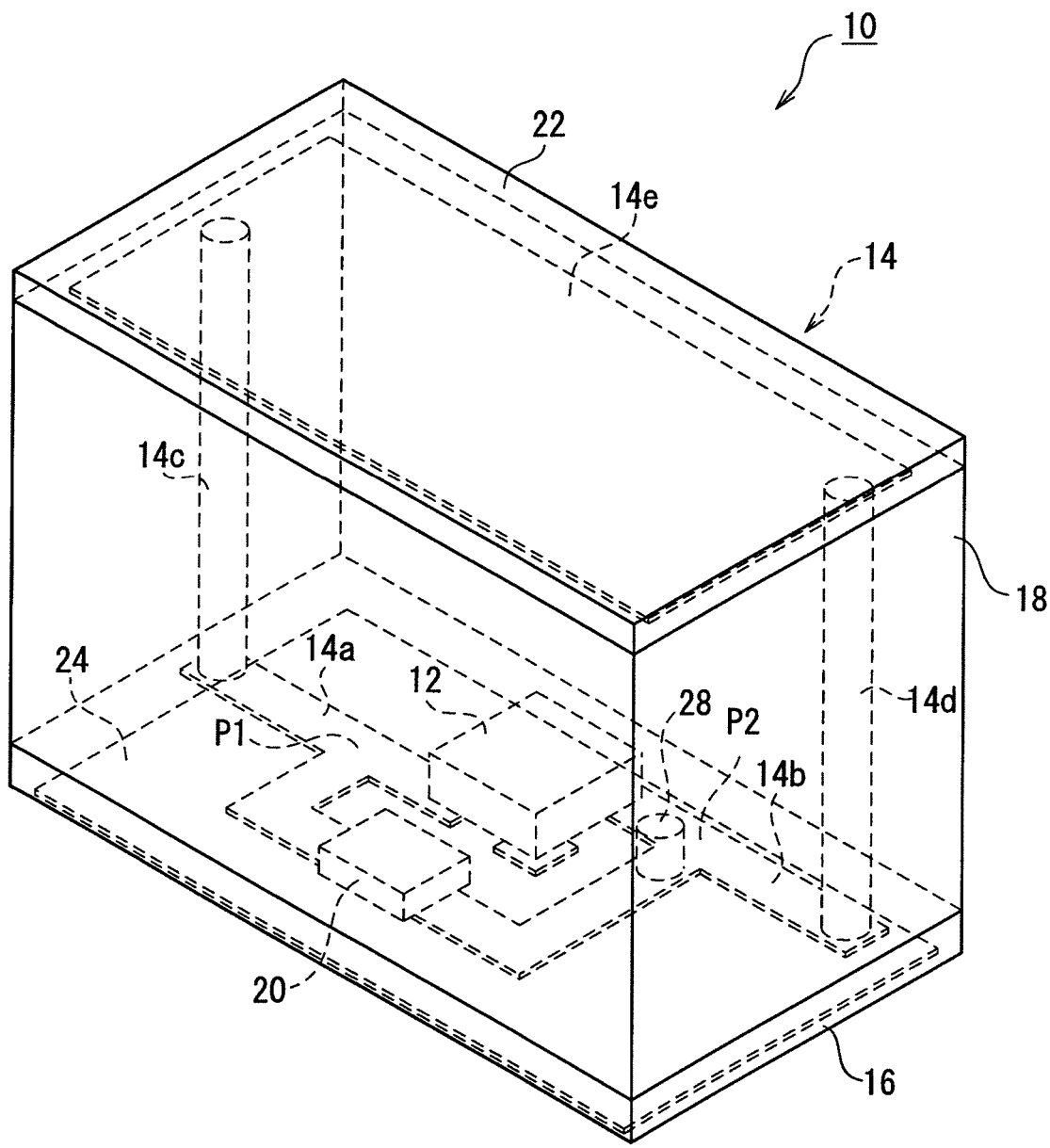
FIG. 1 is a perspective view of a wireless communication device according to a first exemplary embodiment.

A wireless communication device according to an aspect of the present disclosure includes a flat plate-shaped conductor, an RFIC element including first and second input/output terminals, a loop antenna having one end connected to the first input/output terminal and the other end connected to the second input/output terminal, and a connection conductor connecting the loop antenna and the flat plate-shaped conductor. Moreover, the loop antenna includes a first conductor portion disposed along the flat plate-shaped conductor on one side of the flat plate-shaped conductor and connected to the first input/output terminal, a second conductor portion disposed along the flat plate-shaped conductor on the one side of the flat plate-shaped conductor and connected to the second input/output terminal, a third conductor portion extending from the first conductor portion in a direction away from the flat plate-shaped conductor, a fourth conductor portion extending from the second conductor portion in a direction away from the flat plate-shaped conductor, and a fifth conductor portion connecting the third conductor portion and the fourth conductor portion. In this aspect, the connection conductor connects the second conductor portion of the loop antenna and the flat plate-shaped conductor.

According to this configuration, the wireless communication device is configured to achieve a sufficient communicable distance even when disposed near (or on) a metal surface.

In an exemplary aspect, an inductance of the loop antenna is preferably larger than an inductance of the connection conductor. This configuration can prevent a resonance circuit made up of the inductance of the loop antenna and the capacitance of the RFIC element from entering a non-equilibrium state. As a result, the wireless communication device can communicate at a stable communicable distance.

In another exemplary aspect, the flat plate-shaped conductor preferably has a size entirely overlapping with the loop antenna when viewed in a normal direction of the flat plate-shaped conductor. This configuration prevents the metal surface from affecting the loop antenna and changing the resonance frequency.

For example, preferably, the wireless communication device comprises a board including a first principal surface and a second principal surface opposite to each other. In this case, the first and second conductor portions of the loop antenna are disposed as conductor patterns on the first principal surface; the flat plate-shaped conductor is disposed as a conductor layer on the second principal surface; the connection conductor is disposed as an interlayer connection conductor penetrating through the board and connecting the second conductor portion of the loop antenna and the flat plate-shaped conductor; the third and fourth conductor portions are disposed as metal pins on the first principal surface; the RFIC element and the first to fourth conductor portions of the loop antenna are sealed in a resin block covering the first principal surface of the board; and the fifth conductor portion is disposed on a surface of the resin block.

In another exemplary aspect, the RFIC element may be disposed between the third and fourth conductor portions that are metal pins. As a result, a compressive deformation of the resin block is suppressed, and a damage to the RFIC element due to the compressive deformation is reduced.

In another exemplary aspect, the wireless communication device may comprise an excitation conductor having one end connected to the fifth conductor portion of the loop antenna and the other end that is an open end. This configuration enables the wireless communication device to obtain a larger antenna gain and, as a result, a longer communicable distance can be achieved.

The RFIC element may be configured to communicate at a frequency in the UHF band.

In another exemplary aspect, an article is provided that includes a metal surface; and a wireless communication device attached to the metal surface. In this aspect, the wireless communication device includes a flat plate-shaped conductor disposed to face the metal surface, an RFIC element including first and second input/output terminals, a loop antenna having one end connected to the first input/output terminal and the other end connected to the second input/output terminal, and a connection conductor connecting the loop antenna and the flat plate-shaped conductor. Moreover, the loop antenna includes a first conductor portion disposed along the flat plate-shaped conductor on one side of the flat plate-shaped conductor and connected to the first input/output terminal, a second conductor portion disposed along the flat plate-shaped conductor on the one side of the flat plate-shaped conductor and connected to the second input/output terminal, a third conductor portion extending from the first conductor portion in a direction away from the flat plate-shaped conductor, a fourth conductor portion extending from the second conductor portion in a direction away from the flat plate-shaped conductor, and a fifth conductor portion connecting the third conductor portion and the fourth conductor portion. Yet further, the connection conductor connects the second conductor portion of the loop antenna and the flat plate-shaped conductor.

According to this aspect, even when attached to the metal surface of the article, the wireless communication device is configured to achieve a sufficient communicable distance.

Moreover, in the article, the flat plate-shaped conductor and the metal surface can be electrically connected via a capacitance or can be electrically connected in terms of a direct current.

Exemplary embodiments of the present invention will now be described with reference to the drawings.

First Exemplary Embodiment

Figure 2:
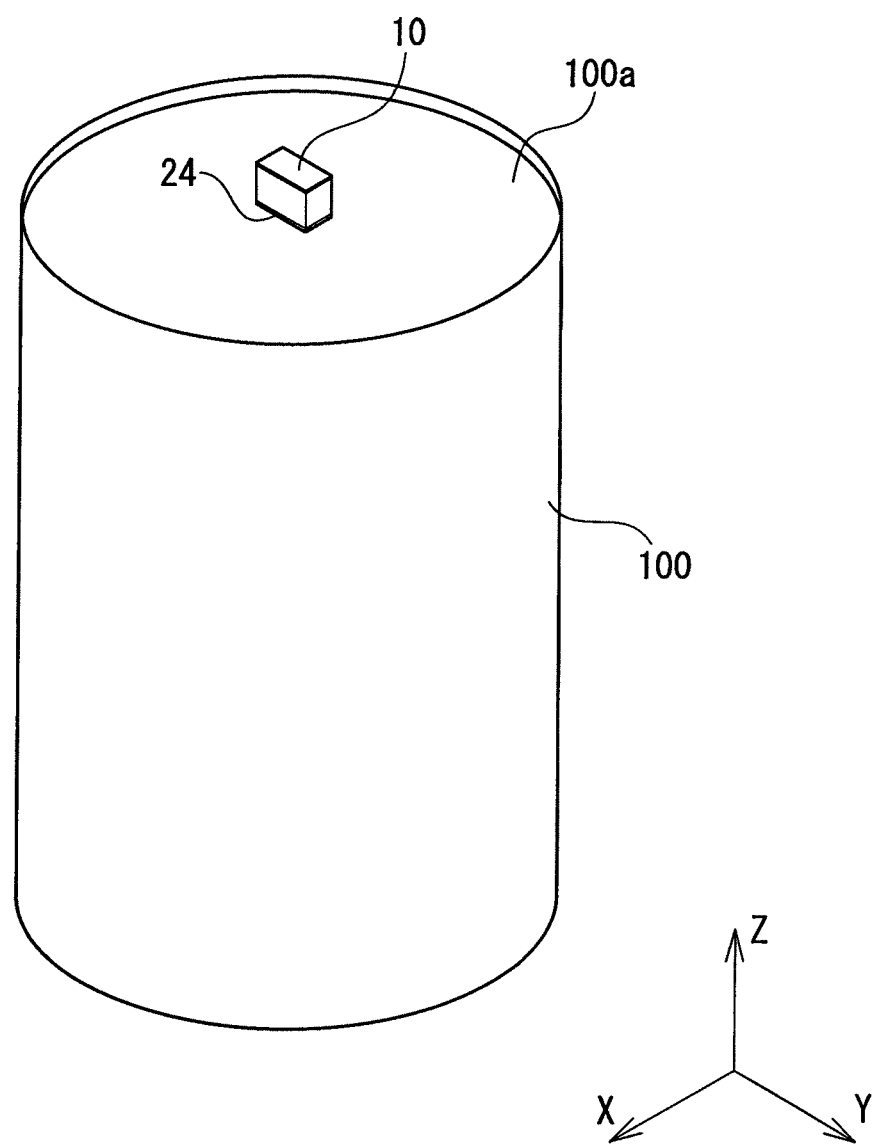
FIG. 2 is a perspective view of the wireless communication device attached to a metal surface of an article.
Figure 3:
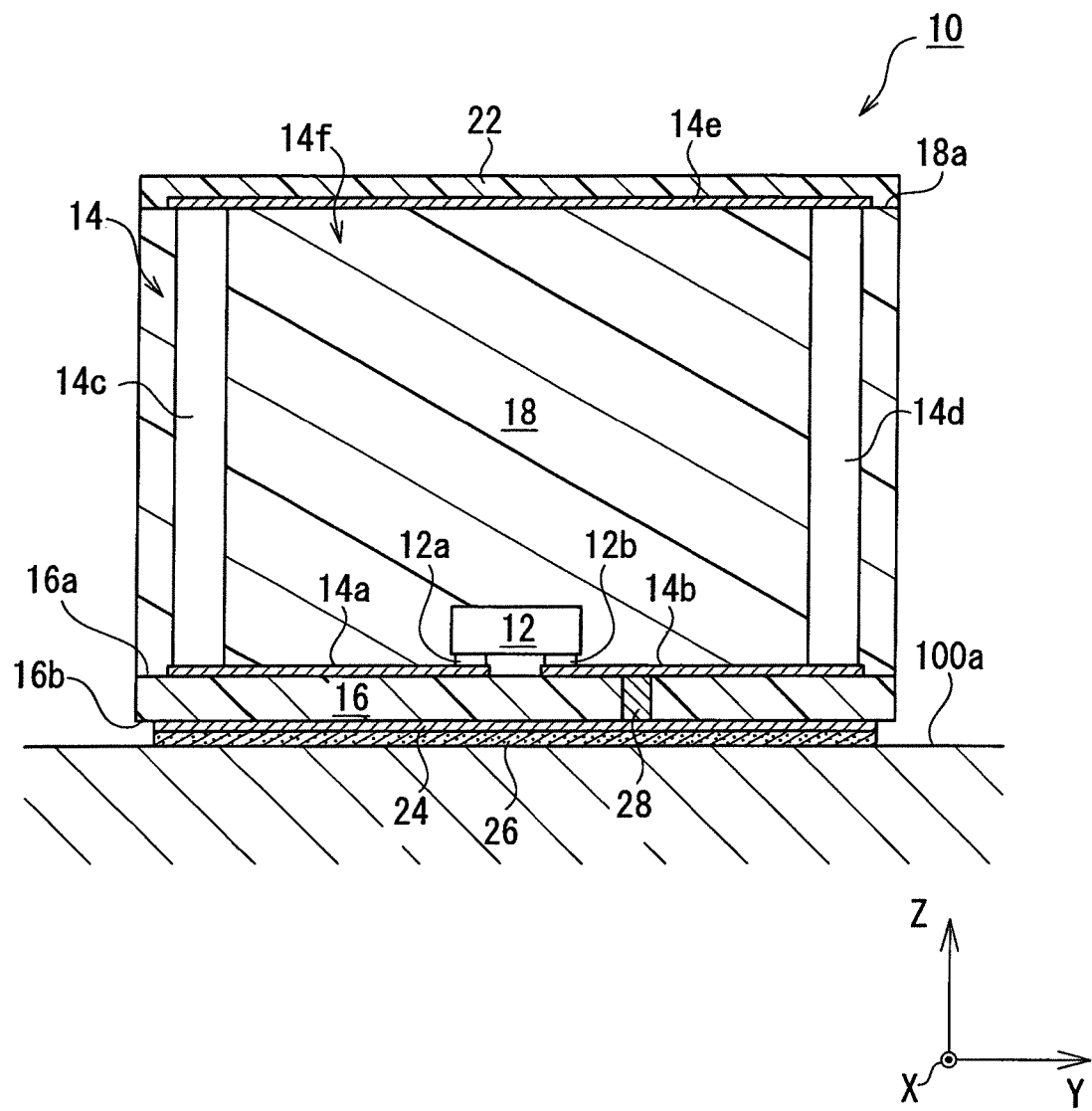
FIG. 3 is a cross-sectional view of the wireless communication device attached to a metal surface of an article.

FIG. 1 is a perspective view of a wireless communication device according to a first exemplary embodiment. FIG. 2 is a perspective view of the wireless communication device attached to a metal surface of an article. FIG. 3 is a cross-sectional view of the wireless communication device.

For purposes of this disclosure, an X-Y-Z coordinate system shown in the figures is a coordinate system having an X-axis direction defined as a depth direction, a Y-axis direction defined as a width direction, and a Z-axis direction defined as a height direction of the wireless communication device. This X-Y-Z coordinate system is shown for facilitating understanding of the invention and does not limit the invention. For example, it should be appreciated that the wireless communication device is not always used in a state in which the height direction (Z-axis direction) is parallel to a vertical direction. Rather, the wireless communication device of the exemplary embodiments can be used in any posture as would be understood to one skilled in the art.

As shown in FIG. 1, a wireless communication device 10 is provided and configured to perform wireless communication at a communication frequency in the UHF band. Therefore the wireless communication device 10 has an RFIC (Radio Frequency Integrated Circuit) element 12 and a loop antenna 14. For the first exemplary embodiment, the wireless communication device 10 has a board 16 and a resin block 18 disposed on the board 16.

Specifically, as shown in FIG. 3, the board 16 includes a first principal surface 16a and a second principal surface 16b opposite to each other in the height direction (i.e., the Z-axis direction). The RFIC element 12 and the loop antenna 14 are mounted on the first principal surface 16a. The resin block 18 is formed on the first principal surface 16a. As a result, the RFIC element 12 and a portion of the loop antenna 14 are sealed and protected in the resin block 18.

As shown in FIG. 3, the loop antenna 14 is made up of five conductors (referred to as "conductor portions") 14a to 14e. Specifically, the loop antenna 14 is made up of the first and second conductor portions 14a, 14b that are conductor patterns formed on the first principal surface 16a of the board 16, the third conductor portion 14c extending from the first conductor portion 14a in a direction (i.e., Z-axis direction) away from (e.g., orthogonal to) the board 16, the fourth conductor portion 14d extending from the second conductor portion 14b in the direction away from (e.g., orthogonal to) the board 16, and the fifth conductor portion 14e connecting the third conductor portion 14c and the fourth conductor portion 14d.

As shown in FIG. 3, one end of the first conductor portion 14a of the loop antenna 14 is connected to a first input/output terminal 12a of the RFIC element 12. Moreover, the other end of the first conductor portion 14a is connected to the third conductor portion 14c.

One end of the second conductor portion 14b of the loop antenna 14 is connected to a second input/output terminal 12b of the RFIC element 12. Moreover, the other end of the first conductor portion 14b is connected to the fourth conductor portion 14d.

Figure 4:
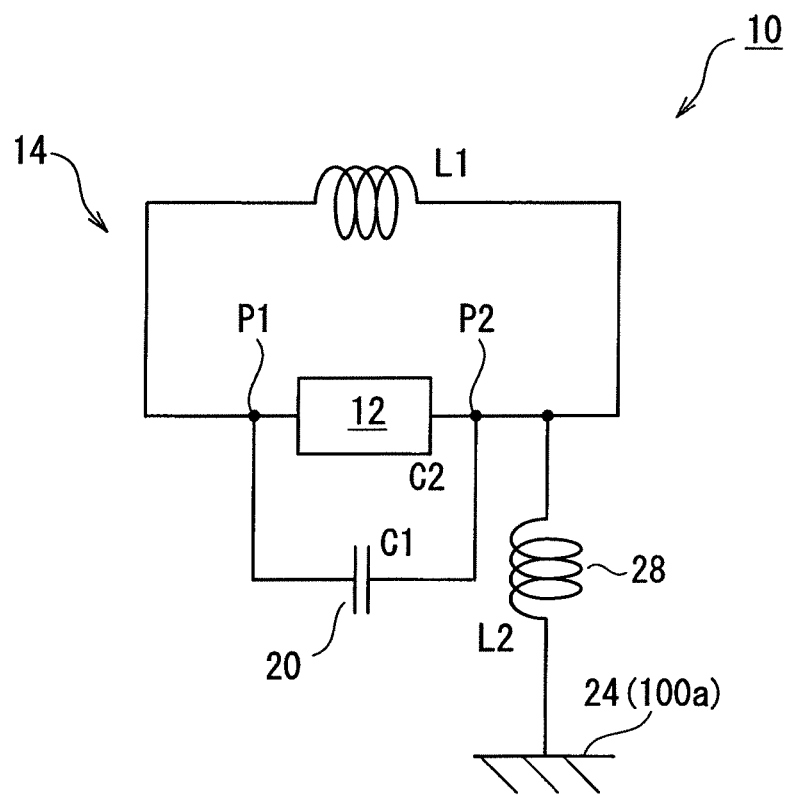
FIG. 4 is an equivalent circuit diagram of the wireless communication device according to the first exemplary embodiment.

FIG. 4 illustrates an equivalent circuit of the wireless communication device 10. As shown, the first and second conductor portions 14a, 14b are both connected to a capacitor chip 20 disposed parallel to the RFIC element 12. Details of this equivalent circuit will be described later.

According to the first embodiment, the third conductor portion 14c of the loop antenna 14 is made up of a metal pin. Moreover, the third conductor portion 14c extends from the first conductor portion 14a in the height direction (Z-axis direction) and reaches an upper surface 18a of the resin block 18.

According to the first embodiment, the fourth conductor portion 14d of the loop antenna 14 is made up of a metal pin. Moreover, the fourth conductor portion 14d extends from the second conductor portion 14b in the height direction (Z-axis direction) and reaches the upper surface 18a of the resin block 18.

According to the first embodiment, the third and fourth conductor portions 14c, 14d are made up of metal pins and sealed in the resin block 18. As shown in FIG. 1, the RFIC element 12 and the capacitor chip 20 are arranged between the third and fourth conductor portions 14c, 14d. The third and fourth conductor portions 14c, 14d made up of metal pins as described above are configured to suppress a compression deformation of the resin block 18 in the height direction (Z-axis direction). This configuration effectively reduces damage to the RFIC element 12 and the capacitor chip 20 due to the compressive deformation of the resin block 18.

The fifth conductor portion 14e of the loop antenna 14 is formed as a rectangular conductor layer on the upper surface 18a of the resin block 18 formed on the first principal surface 16a of the board 16. In this aspect, the fifth conductor portion 14e connects the third conductor portion 14c and the fourth conductor portion 14d. The fifth conductor portion 14e is covered and protected with a protective layer 22 according to an exemplary aspect.

The loop antenna 14 is made up of the multiple conductor portions 14a to 14e as described above and is disposed on the first principal surface 16a of the board 16 as shown in FIG. 3, such that an opening direction (substantially X-axis direction) of a loop opening 14f thereof becomes substantially parallel along the first principal surface 16a of the board 16.

As shown in FIG. 3, a flat plate-shaped conductor 24 is disposed on the second principal surface 16b of the board 16. In the case of the first embodiment, the flat plate-shaped conductor 24 is a conductor layer formed substantially entirely on the second principal surface 16b.

Since the flat plate-shaped conductor 24 is disposed on the second principal surface 16b, the first and second conductor portions 14a, 14b of the loop antenna 14 are arranged substantially parallel along the flat plate-shaped conductor 24. The third conductor portion 14c extends from the first conductor portion 14a in the direction (Z-axis direction) away from the flat plate-shaped conductor 24. Additionally, the fourth conductor portion 14d extends from the second conductor portion 14b in the direction away from the flat plate-shaped conductor 24. Therefore, in this configuration, the flat plate-shaped conductor 24 is disposed on the board 16 substantially parallel along the opening direction (substantially X-axis direction) of the loop opening 14f of the loop antenna 14.

As shown in FIG. 2, as described in detail later, the wireless communication device 10 is configured to be usable when attached to a metal surface 100a of an article 100, and this flat plate-shaped conductor 24 is disposed in parallel to face the metal surface 100a of the article 100. For example, as shown in FIG. 3, the flat plate-shaped conductor 24 is disposed to face the metal surface 100a in a state of being affixed via a conductive adhesive 26. As a result, the flat plate-shaped conductor 24 is connected electrically (in terms of a direct current) to the metal surface 100a.

Moreover, as shown in FIGS. 1 and 3, the flat plate-shaped conductor 24 is connected electrically (in terms of a direct current) to the loop antenna 14. Specifically, the flat plate-shaped conductor 24 is connected through a connection conductor 28 to the second conductor portion 14b of the loop antenna 14. According to this embodiment, the connection conductor 28 is an interlayer connection conductor such as a via hole conductor or a through-hole conductor formed in the board 16.

The structure of the wireless communication device 10 according to an exemplary embodiment has been described above. A communication method of the wireless communication device 10 will hereinafter be described.

First, as shown in FIGS. 2 and 3, the wireless communication device 10 is configured to be attached to the metal surface 100a of the article 100 before use. Specifically, as shown in FIG. 3, the flat plate-shaped conductor 24 is disposed to face the metal surface 100a via the conductive adhesive 26. As a result, the flat plate-shaped conductor 24 is connected electrically (in terms of a direct current) to the metal surface 100a.

As shown in FIG. 4, a resonance circuit includes an inductance L1 of the loop antenna 14, a capacitance C1 of the capacitor chip 20, and a capacitance C2 of the RFIC element 12. Specifically, the capacitance of the capacitor chip 20 and the shape of the loop antenna 14 are determined such that the resonance frequency of the resonance circuit substantially coincides with a communication frequency of the UHF band defined as a communication frequency used by the RFIC element 12.

As shown in FIG. 3, the opening direction of the loop opening 14f of the loop antenna 14 is substantially parallel to the flat plate-shaped conductor 24, i.e., the metal surface 100a. Therefore, a magnetic field formed by the loop antenna 14 is minimally affected by the metal surface 100a. Thus, when radio waves having a frequency in the UHF band are received from an external communication apparatus (e.g., a reader/writer for an RFID tag), a current flows through the loop antenna 14, and the current is supplied to the RFIC element 12. The RFIC element 12 driven by receiving the supply of the electric current transmits information stored in a storage part such as a memory therein to the outside through the loop antenna 14 and the metal surface 100a of the article 100. A method of transmitting (radiating) radio waves via the metal surface 100a will be described later.

As shown in FIG. 4, and as described above, the resonance circuit is made up of the inductance L1 of the loop antenna 14, the capacitance C1 of the capacitor chip 20, and the capacitance C2 of the RFIC element 12. Therefore, an impedance is maximized at one end P1 of the RFIC element 12 (one end of the capacitor 20) in the first conductor portion 14a. As a result, this end P1 can be considered as a voltage maximum point. The other end P2 of the RFIC element 12 in the second conductor portion 14b can be considered as a ground potential.

Moreover, the other end P2 of the RFIC element 12 (i.e., the second conductor portion 14b) is electrically connected to the metal surface 100a of the article 100 via the connection conductor 28 and the flat plate-shaped conductor 24. Therefore, the metal surface 100a is also configured as the ground potential. Thus, the metal surface 100a can be used as a radiation plate. In other words, the metal surface 100a functions as a booster for the loop antenna 14. By using this metal surface 100a as a radiation plate, the communicable distance of the radio communication device 10 can be increased as compared with conventional designs of such wireless communication devices.

As further shown in FIG. 3, the flat plate-shaped conductor 24 of the wireless communication device 10 and the metal surface 100a of the article 100 are connected in terms of a direct current via the conductive adhesive 26. Solder may be used instead of the conductive adhesive 26. Alternatively, an insulating adhesive may be used. If the insulating adhesive is used, the flat plate-shaped conductor 24 and the metal surface 100a are capacitively coupled. When this capacitance is larger, i.e., a distance between the flat plate-shaped conductor 24 and the metal surface 100a is smaller or a permittivity of the insulating adhesive is higher, the metal surface 100a serving as a radiation plate is further improved in radiation efficiency, and the communicable distance consequently also increases.

As shown in FIG. 4, the connection conductor 28 also has an inductance L2. Considering the stability of communication, the inductance L1 of the loop antenna 14 is preferably larger than the inductance L2 of the connection conductor 28. On the contrary, if the inductance L1 is smaller than the inductance L2, the resonance circuit made up of the inductance L1 of the loop antenna 14, the capacitance C1 of the capacitor chip 20, and the capacitance C2 of the RFIC element 12 may enter a non-equilibrium state. As a result, communication may become unstable at the resonance frequency. Therefore, the length of the connection conductor 28, i.e., the thickness of the board 16, is preferably as small as possible.

Additionally, as shown in FIGS. 1 and 3, the flat plate-shaped conductor 24 preferably has a surfaced size that entirely overlaps with the loop antenna 14 when viewed in a normal direction thereof (i.e., the Z-axis direction). This configuration prevents the current flowing through the metal surface 100a of the article 100 from affecting the loop antenna 14 and changing the resonance frequency.

An example of a method of manufacturing the wireless communication device 10 will hereinafter be described with reference to FIGS. 5A to 5E.

Figure 5A:
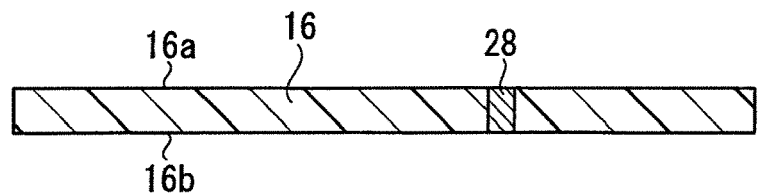
FIG. 5A is a cross-sectional view showing a process in a method of manufacturing an example of the wireless communication device.

As shown in FIG. 5A, first, a through-hole penetrating from the first principal surface 16a toward the second principal surface 16b is formed in the board 16. This through-hole is filled with a conductor, such as copper, to manufacture the connection conductor 28 that serves as the interlayer connection conductor.

Figure 5B:
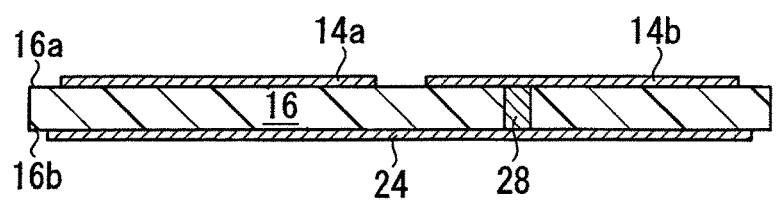
FIG. 5B is a cross-sectional view showing the manufacturing process of the wireless communication device continued from FIG. 5A.

Subsequently, as shown in FIG. 5B, the first and second conductor portions 14a, 14b serving as portions of the loop antenna 14 are manufactured by using a conductive material such as copper on the first principal surface 16a of the board 16. The flat plate-shaped conductor 24 is also manufactured by using a conductive material such as copper on the second principal surface 16b of the board 16. As a result, the second conductor portion 14b and the flat plate-shaped conductor 24 are electrically connected through the connection conductor 28.

Figure 5C:
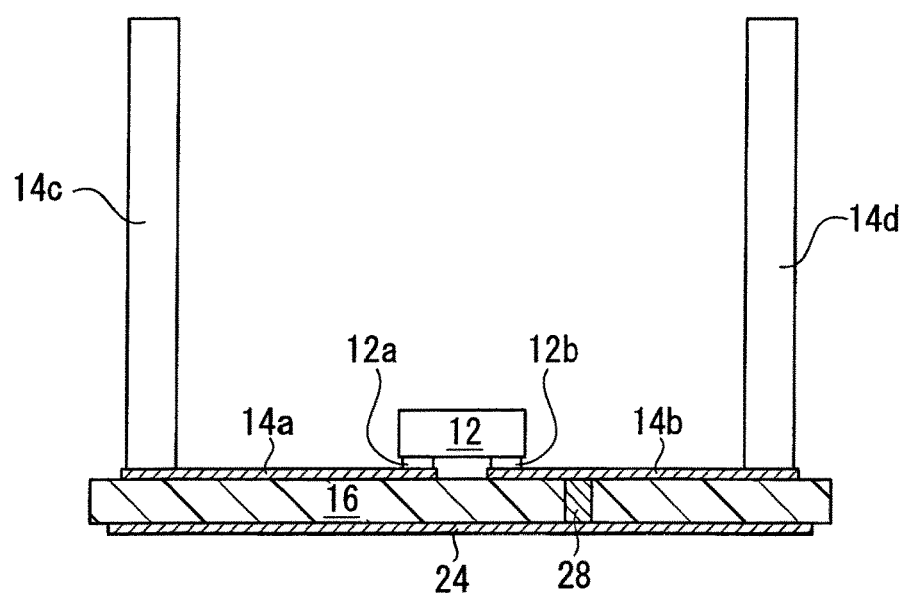
FIG. 5C is a cross-sectional view showing the manufacturing process of the wireless communication device continued from FIG. 5.

Subsequently, as shown in FIG. 5C, the RFIC element 12 is mounted on the first principal surface 16a of the board 16. The first input/output terminal 12a of the RFIC element 12 and the first conductor portion 14a are electrically connected by soldering or the like for example, and the second input/output terminal 12b and the second conductor portion 14b are electrically connected in the same way. The third conductor portion 14c, i.e., a metal pin made of a conductive material such as copper, is vertically disposed on the first conductor portion 14a, and the fourth conductor portion 14d is vertically disposed on the second conductor portion 14b in the same way.

Figure 5D:
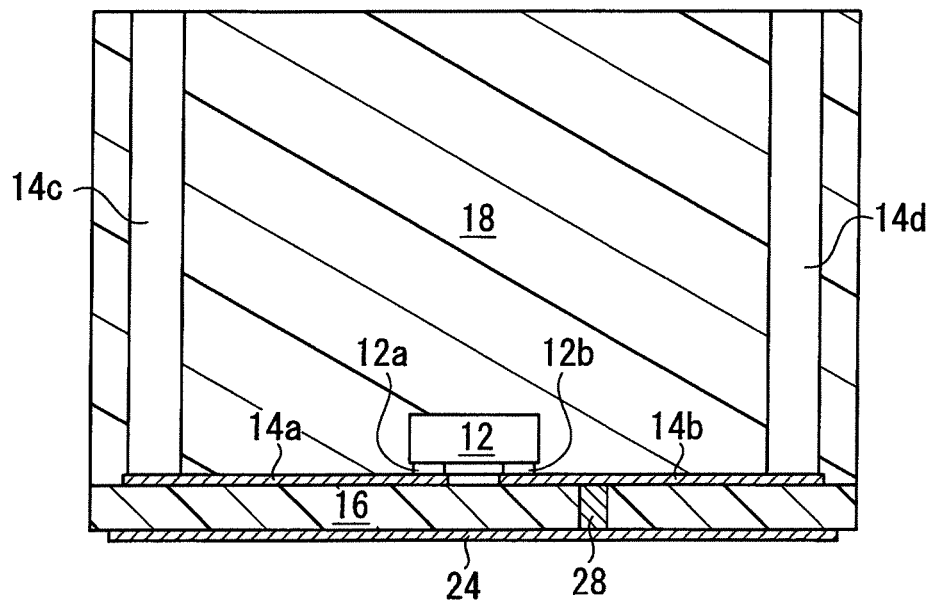
FIG. 5D is a cross-sectional view showing the manufacturing process of the wireless communication device continued from FIG. 5C.

Subsequently, as shown in FIG. 5D, the resin block 18 is formed on the first principal surface 16a of the board 16. As a result, the RFIC element 12 and the first to fourth conductor portions 14a to 14d are sealed in the resin block 18.

Figure 5E:
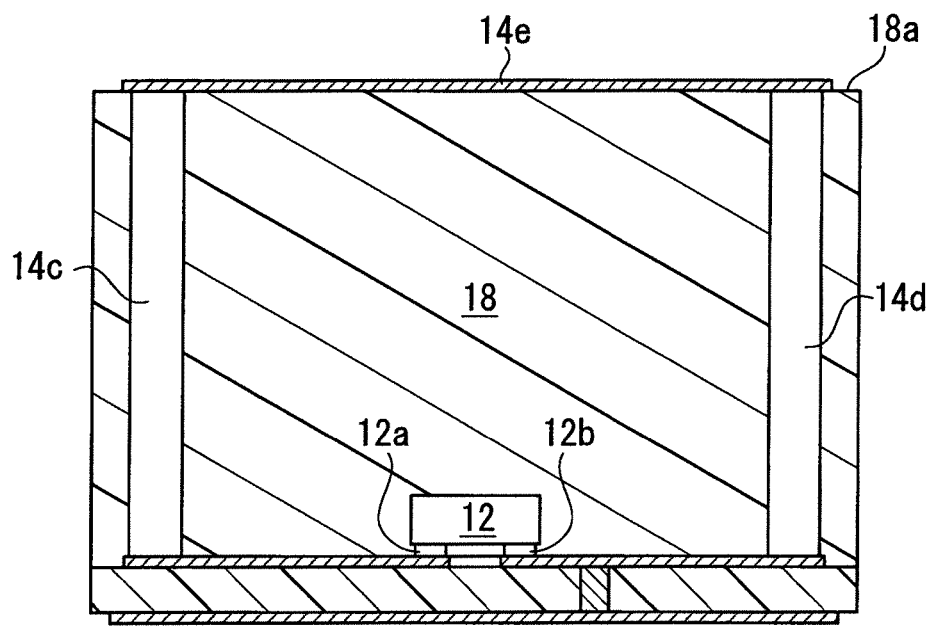
FIG. 5E is a cross-sectional view showing the manufacturing process of the wireless communication device continued from FIG. 5D.

Subsequently, as shown in FIG. 5E, the fifth conductor portion 14e is manufactured by using a conductive material such as copper on the upper surface 18a of the resin block 18. As a result, the third conductor portion 14c and the fourth conductor portion 14d are electrically connected by the fifth conductor portion 14e. The fifth conductor portion 14e is then covered with the protective layer 22 to complete the wireless communication device 10 as shown in FIG. 3.

According to the first exemplary embodiment as described above, the wireless communication device 10 is configured to achieve a sufficient communicable distance even when disposed near the metal surface 100a. In other words, the radio communication device 10 can use the metal surface 100a as a radiation plate to ensure a sufficient communicable distance.

Second Exemplary Embodiment

A second embodiment is a variation of the first exemplary embodiment described above. Therefore, the second embodiment will mainly be described in terms of differences. Constituent elements that are substantially the same as those of the first embodiment are denoted by the same reference numerals and such a description of these components will not be repeated in detail.

Figure 6:
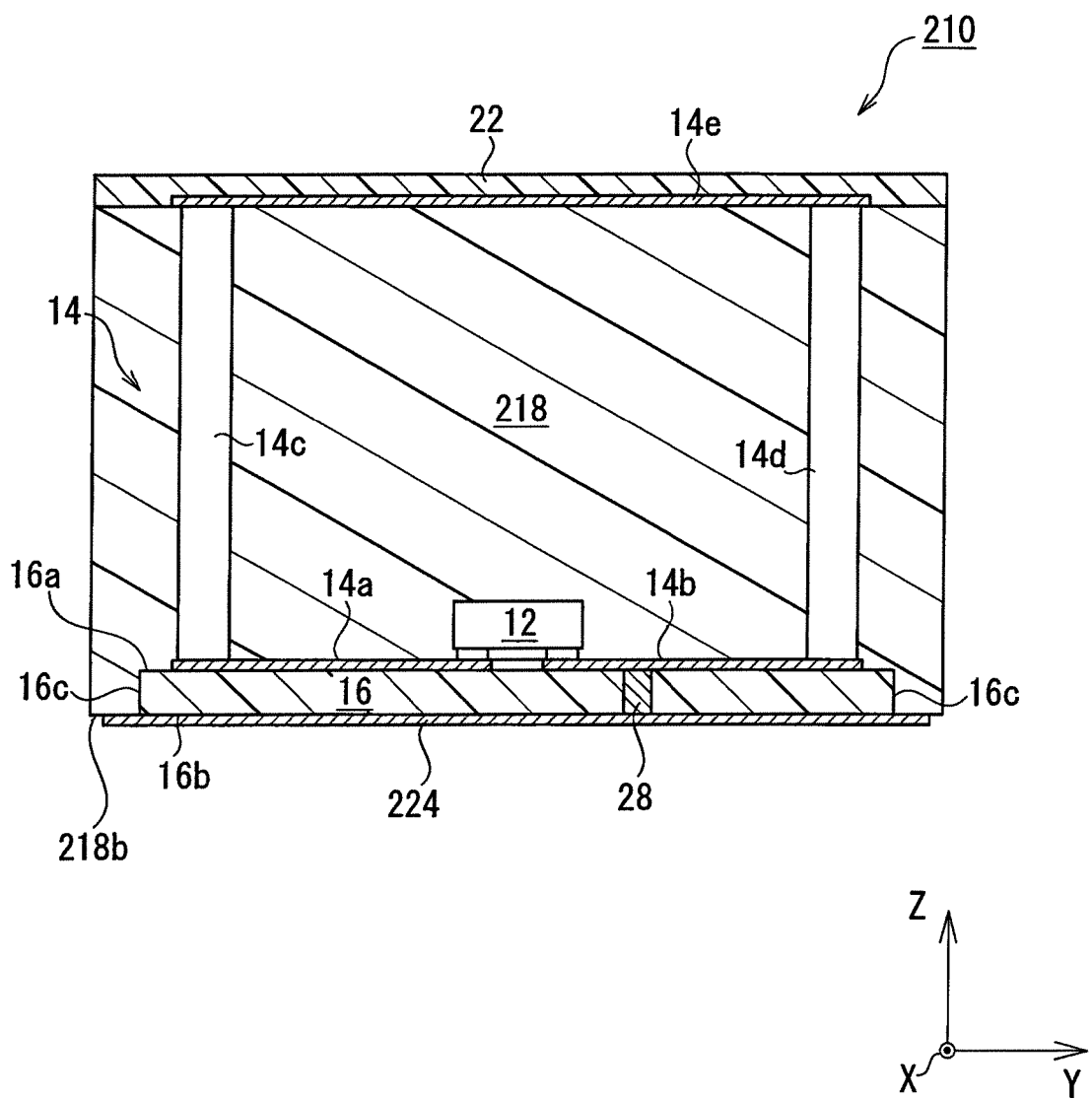
FIG. 6 is a cross-sectional view of a wireless communication device according to a second exemplary embodiment.

Specifically, FIG. 6 is a cross-sectional view of a wireless communication device according to the second exemplary embodiment.

As shown in FIG. 6, in the wireless communication device 210 of the second embodiment, the board 16 has both the first principal surface 16a and also an end surface 16c covered with a resin block 218. In this case, as compared to when the resin block 18 covers only the first principal surface 16a as in the first embodiment (as shown in FIG. 3), the RFIC element 12 and the capacitor chip 20 on the first principal surface 16a are further protected. For example, moisture rarely reaches the RFIC element or the capacitor chip through an interface between the resin block and the board. Therefore, according to the second embodiment, the RFIC element 12 and the capacitor chip 20 are further improved in reliability. Additionally, in the case of the second embodiment, the resin block and the board can be bonded with higher bonding strength.

As shown in FIG. 6, according to the second embodiment, the flat plate-shaped conductor 24 can have a size exceeding the contour of the second principal surface 16b of the board 16. Therefore, the flat plate-shaped conductor 24 is disposed on the entire second principal surface 16b of the board 16 and a portion of a lower surface 218b of the resin block 218. As a result, the metal surface 100a facing the flat plate-shaped conductor 24 and functioning as a radiation plate increases in radiation efficiency, and a greater communicable distance can consequently be achieved (as compared to when the flat plate-shaped conductor 24 is disposed only on the second principal surface 16b).

According to the second embodiment as described above, as with the radio communication device 10 of the first embodiment, a sufficient communicable distance can be achieved even when the device is disposed near (or on) the metal surface 100a.

Third Exemplary Embodiment

A third embodiment is a variation of the first exemplary embodiment described above. Therefore, the third embodiment will mainly be described in terms of differences. Constituent elements substantially the same as those of the first embodiment are denoted by the same reference numerals and such a description of these components will not be repeated in detail.

Figure 7:
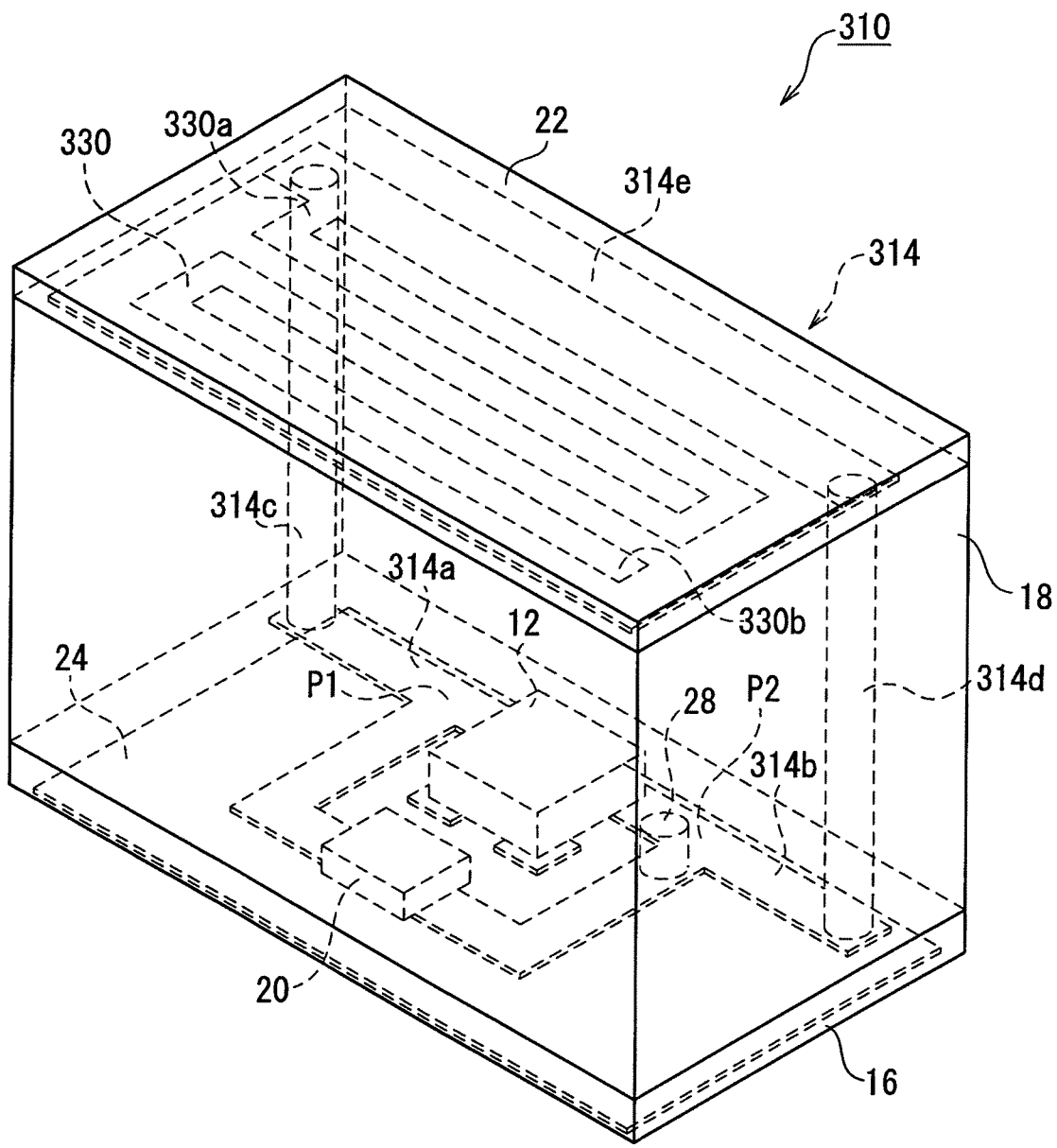
FIG. 7 is a perspective view of a wireless communication device according to a third exemplary embodiment.
Figure 7:
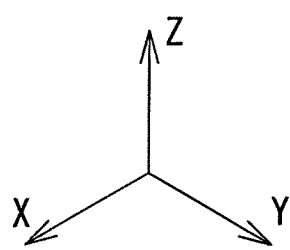
Figure 8:
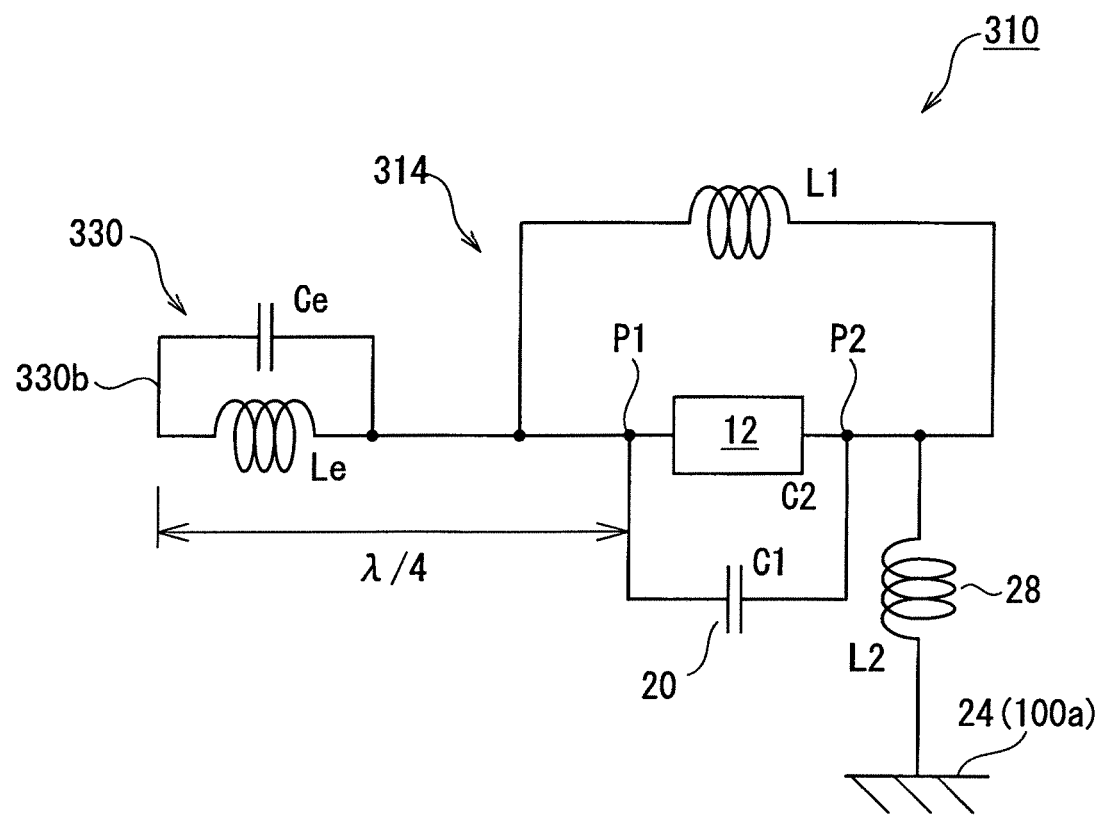
FIG. 8 is an equivalent circuit diagram of the wireless communication device according to the third exemplary embodiment.

Specifically, FIG. 7 is a perspective view of a wireless communication device according to the third exemplary embodiment, and FIG. 8 is an equivalent circuit diagram.

As shown in FIGS. 7 and 8, the wireless communication device 310 includes an excitation conductor 330 for obtaining a larger antenna gain. As shown in FIG. 7, the excitation conductor 330 is a meander-shaped conductor and has one end 330a connected to a fifth conductor portion 314e of the loop antenna 314 and another, second end 330b that is an open end.

As with the fifth conductor portion 314e of the loop antenna 314, the excitation conductor 330 is formed as a conductor pattern on the resin block 18 and is covered and protected with the protective layer 22.

The excitation conductor 330 is preferably connected at the one end 330a to a portion on the high potential side of the fifth conductor portion 314e, or in other words, a portion distant from the flat plate-shaped conductor 24 having the ground potential in terms of an electric path. Therefore, the excitation conductor 330 is connected at the one end 330a to a portion of the fifth conductor portion 314e close to a third conductor portion 314c.

As shown in FIG. 8, a distance from the end P1 of the RFIC element 12 (i.e., the end of the capacitor 20) to the open end 330b is preferably ¼ of a wavelength λ of the radio waves communicated by the wireless communication device 310. Since the excitation conductor 330 as described above is included, the wireless communication device 310 can obtain a larger antenna gain as compared to when the excitation conductor 330 is not included. As a result, a longer communicable distance can be achieved.

A reactance Le of the excitation conductor 330 shown in FIG. 8 can be adjusted by a length from the one end 330a to the open end 330b of the excitation conductor 330, and a capacitance Ce can be adjusted by a distance between conductor portions extending parallel in the meander-shaped excitation conductor 330.

According to the third embodiment as described above, as with the radio communication device 10 of the first embodiment, a sufficient communicable distance can be achieved even when the device is disposed near the metal surface 100a.

Although the present invention has been described with reference to the first to third exemplary embodiments, it should be appreciated that the exemplary embodiments of the present invention are not limited thereto.

For example, in the case of the first embodiment, as shown in FIG. 4, the resonance circuit of the wireless communication device 10 is made up of the inductance L1 of the loop antenna 14, the capacitance C1 of the capacitor chip 20, and the capacitance C2 of the RFIC element 12. Alternatively, a resonance circuit can be made up only of the capacitance C2 of the RFIC element 12 and the inductance L1 of the loop antenna 14 without using the capacitor chip 20.

In this case, however, the shape of the loop antenna 14 is uniquely determined in terms of, for example, the lengths and thicknesses of the third and fourth conductor portions 14c, 14d that are metal pins. This reduces the degree of freedom in design of the wireless communication device 10. Therefore, to ensure the degree of freedom in design of the wireless communication device 10, preferably, the capacitor chip 20 is used. Using the capacitor chip 20 increases the degree of freedom in selection in terms of the lengths and thicknesses of the metal pins of the loop antenna 14, i.e., the value of the inductance L1 of the loop antenna 14. As a result, the loop antenna 14 is improved in Q characteristic of the inductance, and a matching loss is suppressed while a radiation efficiency is improved. Consequently, the communicable distance of the wireless communication device 10 can be further increased.

By merely replacing the capacitor chip 20 with those having different capacities C1, the wireless communication device 10 can be configured to communicate at various communication frequencies. Therefore, the various wireless communication devices 10 having different communicable distances can easily be manufactured.

For example, in the case of the first embodiment described above, the loop antenna 14 is made up of the five separate conductor portions 14a to 14e as shown in FIG. 1. However, the exemplary embodiments of the present invention are not limited thereto. For example, the third conductor portion 14c, the fourth conductor portion 14d, and the fifth conductor portion 14e may be integrated into a single member.

For example, in the case of the first embodiment, as shown in FIG. 3, the wireless communication device 10 has the flat plate-shaped conductor 24 attached to the metal surface 100a of the article 100 via the conductive adhesive 26. However, the exemplary embodiments are not limited thereto. The flat plate-shaped conductor may not necessarily be attached to the article via the adhesive, and the flat plate-shaped conductor may merely be disposed to face a metal surface of an article. Therefore, the device may be fixed at a portion other than the flat plate-shaped conductor to the article. When facing the flat plate-shaped conductor, the metal surface of the article can function as a radiation plate, i.e., a booster, for the loop antenna.

Additionally, in the case of the first embodiment, as shown in FIG. 1, the loop antenna 14 is a so-called one-turn loop. However, in the embodiments of the present invention, the number of turns of the loop antenna is not limited.

Figure 9:
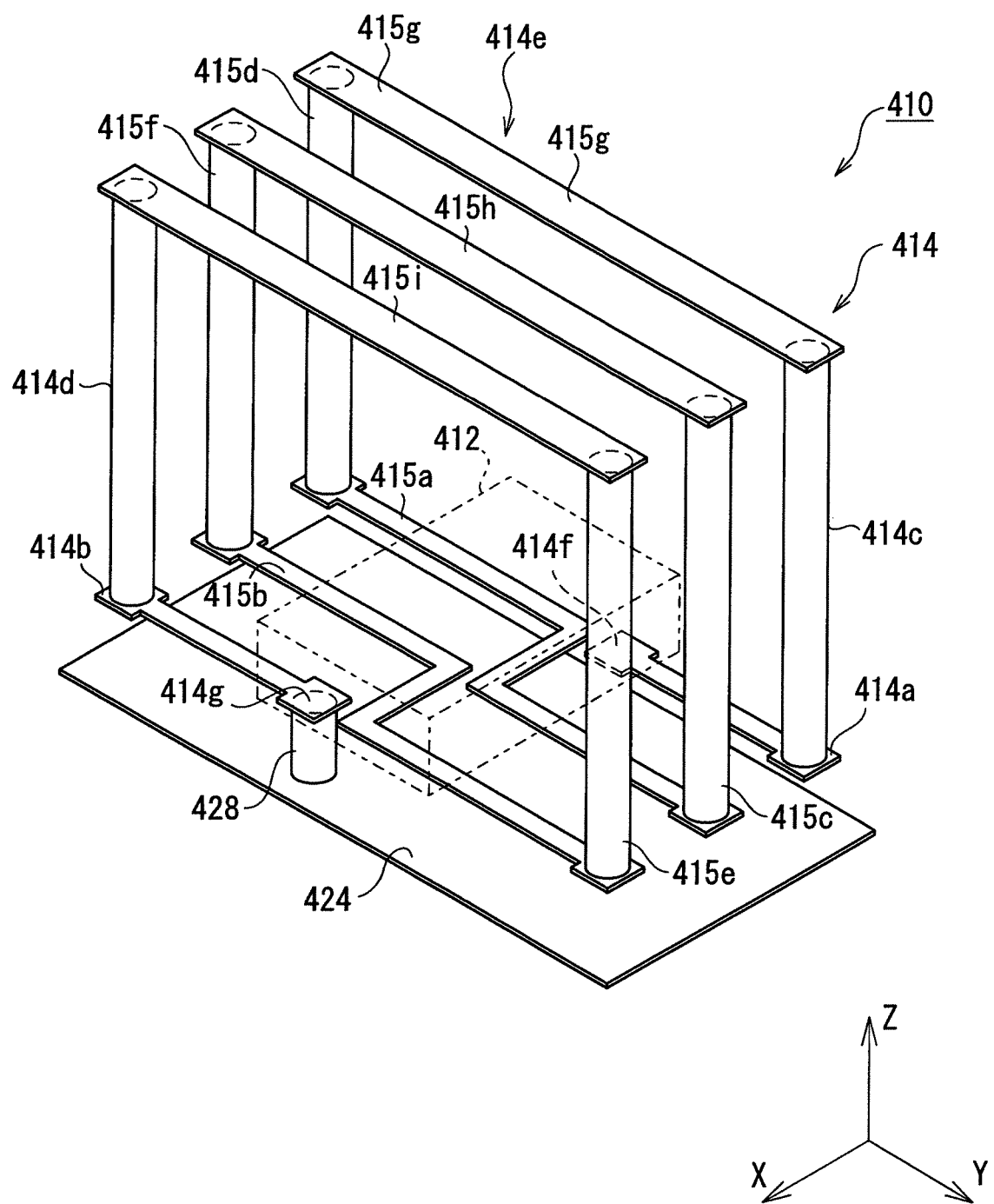
FIG. 9 is a perspective view of a loop antenna in a wireless communication device according to a further exemplary embodiment.

FIG. 9 is a perspective view of a loop antenna of a wireless communication device according to another exemplary embodiment. In FIG. 9, some of the constituent elements such as a board are not shown.

As shown in FIG. 9, a wireless communication device 410 according to the further embodiment includes a three-turn loop antenna 414.

The loop antenna 414 includes a first conductor portion 414a disposed along a flat plate-shaped conductor 424 and connected to a first input/output terminal of the RFIC element 412, a second conductor portion 414b disposed along the flat plate-shaped conductor 424 and connected to a second input/output terminal of the RFIC element 412, a third conductor portion 414c extending from the first conductor portion 414a in a direction away from the flat plate-shaped conductor 424, a fourth conductor portion 414d extending from the second conductor portion 414b in a direction away from the flat plate-shaped conductor 424, and a fifth conductor portion 414e connecting the third conductor portion 414c and the fourth conductor portion 414d. The first conductor portion 414a includes a land 414f connected to the first input/output terminal of the RFIC element 412. The second conductor portion 414b includes a land 414g connected to the second input/output terminal of the RFIC element 412. The land 414g and the flat plate-shaped conductor 424 are connected through a connection conductor 428.

The fifth conductor portion 414e of the loop antenna 414 is a two-looped conductor having one end connected to the third conductor portion 414c and the other end connected to the fourth conductor portion 414d. Specifically, the fifth conductor portion 414e includes a first sub-conductor portion 415a and a second sub-conductor portion 415b extending along the flat plate-shaped conductor 424 and parallel to each other between the first and second conductor portions 414a, 414b. The fifth conductor portion 414e includes third and fourth sub-conductor portions 415c, 415d such as metal pins extending from both respective ends of the first sub-conductor portion 415a in a direction away from the flat plate-shaped conductor 424. Furthermore, the fifth conductor portion 414e includes fifth and sixth sub-conductor portions 415e, 415f such as metal pins extending from both respective ends of the second sub-conductor portion 415b in a direction away from the flat plate-shaped conductor 424. The fifth conductor portion 414e includes a seventh sub-conductor portion 415g connecting the third conductor portion 414c and the fourth sub-conductor portion 415d, an eight sub-conductor portion 415h connecting the third sub-conductor portion 415c and the sixth sub-conductor portion 415f, and a ninth sub-conductor portion 415i connecting the fifth sub-conductor portion 415e and the fourth conductor portion 414d.

Additionally, in the case of the first embodiment, as shown in FIG. 1, the loop antenna 14 has the third conductor portion 14c and the fourth conductor portion 14d made up of metal pins and the fifth conductor portion 14e made up of a conductor layer, which are separate members. However, the exemplary embodiments of the present invention are not limited thereto.

Figure 10:
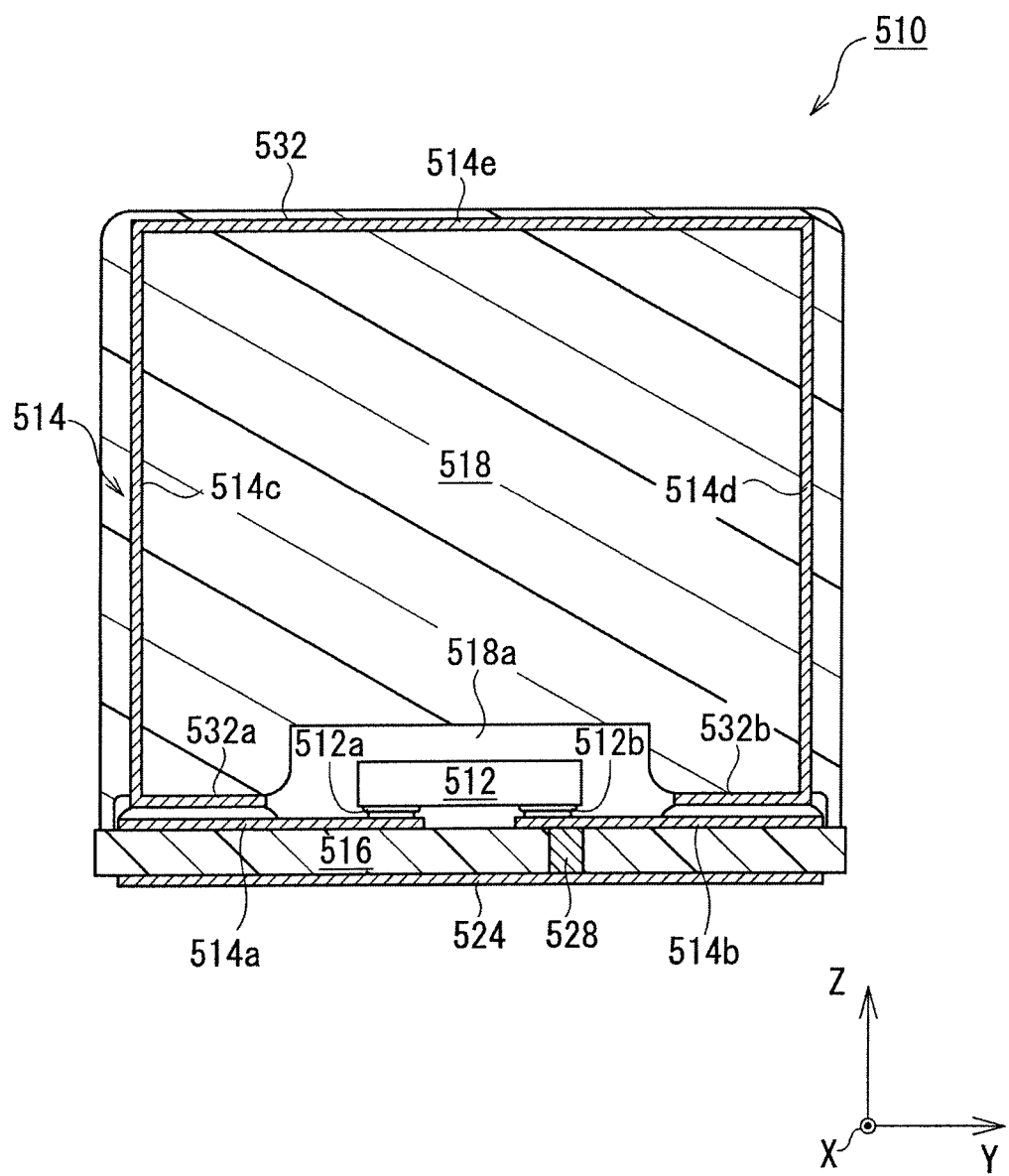
FIG. 10 is a cross-sectional view of the wireless communication device according to a yet further exemplary embodiment.
Figure 11:
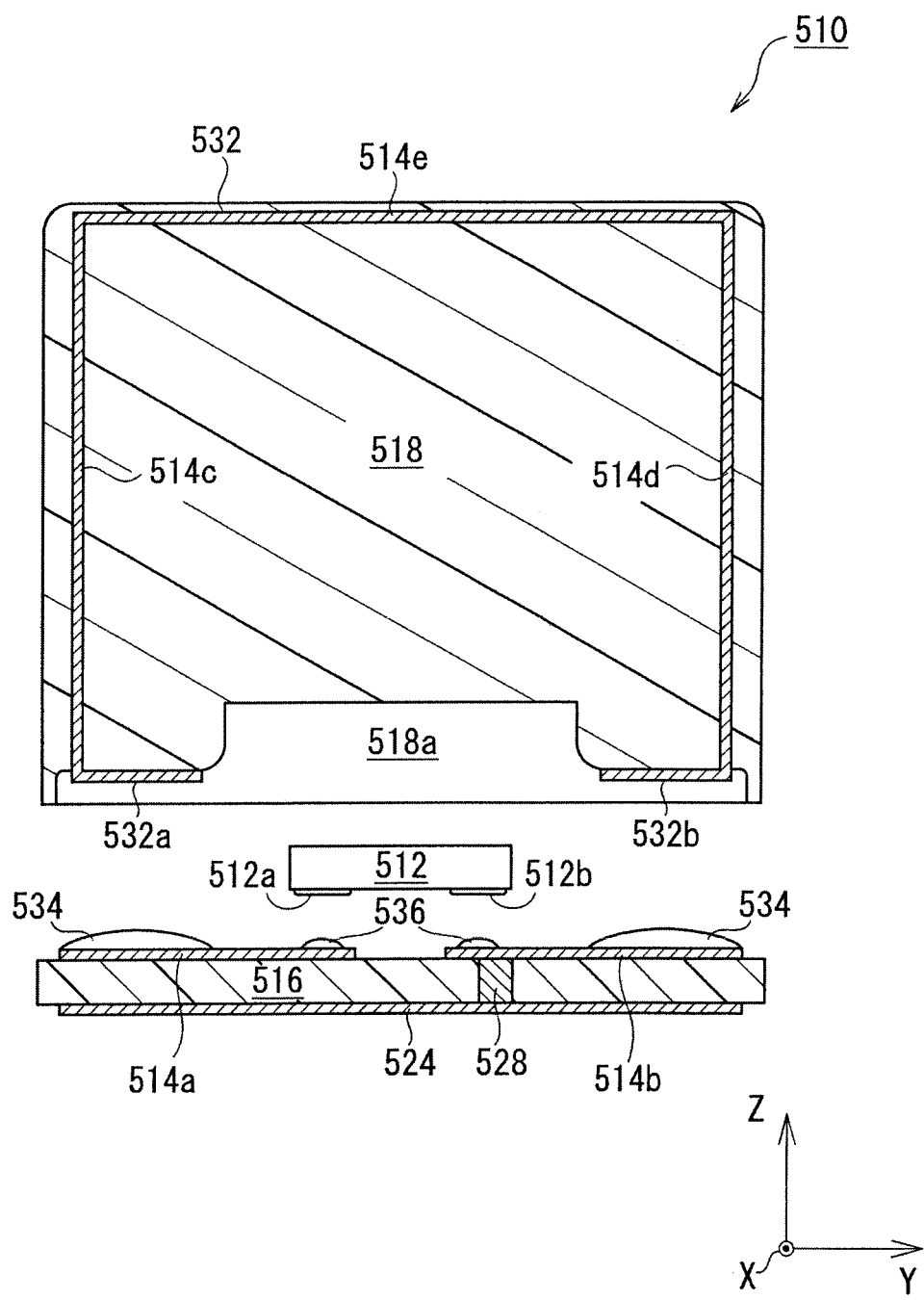
FIG. 11 is an exploded view of the wireless communication device shown in FIG. 10.

FIGS. 10 and 11 show a cross-sectional view and an exploded view of a wireless communication device according to a yet another exemplary embodiment.

As shown in FIG. 10, a wireless communication device 510 according to another exemplary embodiment includes a loop antenna 514.

The loop antenna 514 includes a first conductor portion 514a disposed along a flat plate-shaped conductor 524 and connected to a first input/output terminal 512a of an RFIC element 512, a second conductor portion 514b disposed along the flat plate-shaped conductor 524 and connected to a second input/output terminal 512b of the RFIC element 512, a third conductor portion 514c extending in a direction away from the first conductor portion 514a, a fourth conductor portion 514d extending in a direction away from the second conductor portion 514b, and a fifth conductor portion 514e connecting the third conductor portion 514c and the fourth conductor portion 514d. The second conductor portion 514b is connected through a connection conductor 528 to the flat plate-shaped conductor 524.

Specifically, the loop antenna 514 has the third conductor portion 514c, the fourth conductor portion 514d, and the fifth conductor portion 514e integrated to constitute one portal member 532. Therefore, the third conductor portion 514c, the fourth conductor portion 514d, and the fifth conductor portion 514e are respective different portions of the portal member 532. In other words, the portal member 532 has a rectangular shape in which the third conductor portion 514c, the fourth conductor portion 514d, and the fifth conductor portion 514e form three sides.

The portal member 532 has a first connection terminal 532a as one end connected to the first conductor portion 514a on a board 516 and a second connection terminal 532b as the other end connected to the second conductor portion 514b. Additionally, the portal member 532 is buried in a cap-shaped resin block 518 except the first connection terminal 532a and the second connection terminal 532b. The cap-shaped resin block 518 is provided with a recess 518a for housing the RFIC element 512, the first conductor portion 514a, and the second conductor portion 514b on the board 516. As a result, the resin block 518 covers and protects the element and the portions.

The connection between the first connection terminal 532a of the portal member 532 and the first conductor portion 514a and the connection between the second connection terminal 532b of the portal member 532 and the second conductor portion 514b are achieved via solder bumps 534, for example. Similarly, the connection between the first input/output terminal 512a of the RFIC element 512 and the first conductor portion 514a and the connection between the second input/output terminal 512b and the second conductor portion 514b are achieved via solder bumps 536, for example.

Furthermore, in the case of the first embodiment, as shown in FIG. 1, the RFIC element 12, the first to fourth conductor portions 14*a* to 14*d* of the loop antenna 14, and the capacitor chip 20 are sealed in the resin block 18. The RFIC element 12, the first and second conductor portions 14*a*, 14*b* of the loop antenna 14, and the flat plate-shaped conductor 24 are disposed on the board 16. However, the embodiments of the present invention are not limited thereto.

In a general sense, the wireless communication device of the exemplary embodiments includes a flat plate-shaped conductor, an RFIC element including first and second input/output terminals, a loop antenna having one end connected to the first input/output terminal and the other end connected to the second input/output terminal, and a connection conductor connecting the loop antenna and the flat plate-shaped conductor. Moreover, the loop antenna includes a first conductor portion disposed along the flat plate-shaped conductor on one side of the flat plate-shaped conductor and connected to the first input/output terminal, a second conductor portion disposed along the flat plate-shaped conductor on the one side of the flat plate-shaped conductor and connected to the second input/output terminal, a third conductor portion extending from the first conductor portion in a direction away from the flat plate-shaped conductor, a fourth conductor portion extending from the second conductor portion in a direction away from the flat plate-shaped conductor, and a fifth conductor portion connecting the third conductor portion and the fourth conductor portion. Further, the connection conductor connects the second conductor portion of the loop antenna and the flat plate-shaped conductor.

Regarding an article to which the wireless communication device is attached, the article may entirely be made of a metallic material and consequently include a metallic surface, or the article may be made of a non-metallic material, for example, a resin material, except the metallic surface.

Although the present invention has been described with a plurality of embodiments, it is apparent for those skilled in the art that at least one embodiment can entirely or partially be combined with a certain embodiment to form a further embodiment according to the present invention.

The exemplary embodiments of the present disclosure provide a wireless communication device that includes an RFIC element and that is configured to be disposed near (or on) a metal surface of an article.

EXPLANATIONS OF LETTERS OR NUMERALS

10 wireless communication device
12 RFIC element
12*a* first input/output terminal
12*b* second input/output terminal
14 loop antenna
14*a* first conductor portion
14*b* second conductor portion
14*c* third conductor portion
14*d* fourth conductor portion
14*e* fifth conductor portion
24 flat plate-shaped conductor
28 connection conductor

The invention claimed is:
1. A wireless communication device comprising:
a flat plate-shaped conductor;
an RFIC element including first and second input/output terminals;
a loop antenna having first and second ends connected to the first and second input/output terminals, respectively; and
a connection conductor that connects the loop antenna to the flat plate-shaped conductor,
wherein the loop antenna includes:
a first conductor disposed along the flat plate-shaped conductor and connected to the first input/output terminal,
a second conductor disposed along the flat plate-shaped conductor and connected to the second input/output terminal,
a third conductor extending from the first conductor in a direction away from the flat plate-shaped conductor,
a fourth conductor extending from the second conductor portion in the direction away from the flat plate-shaped conductor, and
a fifth conductor that connects the third and fourth conductors, and
wherein the connection conductor connects the second conductor of the loop antenna to the flat plate-shaped conductor.

2. The wireless communication device according to claim 1, wherein the loop antenna comprises an inductance that is larger than an inductance of the connection conductor.

3. The wireless communication device according to claim 1, wherein the flat plate-shaped conductor comprises a surface that entirely overlaps the loop antenna when viewed in a normal direction of the flat plate-shaped conductor.

4. The wireless communication device according to claim 1, further comprising a board that includes first and second principal surfaces that oppose each other,
wherein the first and second conductors of the loop antenna are disposed as conductor patterns on the first principal surface of the board, and
wherein the flat plate-shaped conductor is disposed as a conductor layer on the second principal surface.

5. The wireless communication device according to claim 4, wherein the connection conductor is disposed as an interlayer connection conductor extending through the board to connect the second conductor of the loop antenna to the flat plate-shaped conductor.

6. The wireless communication device according to claim 5,
wherein the third and fourth conductors comprise metal pins extending from the first principal surface of the board, and
wherein the RFIC element and the first to fourth conductors of the loop antenna are sealed in a resin block that covers the first principal surface of the board.

7. The wireless communication device according to claim 6, wherein the fifth conductor is disposed on a surface of the resin block that is opposite to the board.

8. The wireless communication device according to claim 7, wherein the RFIC element is disposed between the third and fourth conductors.

9. The wireless communication device according to claim 7, wherein the loop antenna defines a loop opening that is parallel to the first principal surface of the board.

10. The wireless communication device according to claim 6, wherein the flat plate-shaped conductor comprises a surface size that is greater than a surface size of the second principal surface of the board.

11. The wireless communication device according to claim 10, wherein the resin block covers side surfaces of the board that extend in a direction orthogonal to the first and second principal surfaces of the board.

12. The wireless communication device according to claim 1, further comprising an excitation conductor having a first end connected to the fifth conductor of the loop antenna and a second end that is an open end.

13. The wireless communication device according to claim 12, wherein the excitation conductor comprises a meandering-shaped conductor.

14. The wireless communication device according to claim 1, wherein the RFIC element is configured to communicate at a frequency in the UHF band.

15. The wireless communication device according to claim 1, wherein the third, fourth and fifth conductors are integrated as a single portal member that is connected to the first and second conducts by a pair of solder connections, respectively.

16. A wireless communication device comprising:
a board having first and second principal surfaces that oppose each other;
a flat plate-shaped conductor disposed on the second principal surface of the board;
a loop antenna having:
first and second conductors disposed on the first principal surface of the board and extending away from each other,
at least one additional conductor extending away from the first principal surface of the board, with the at least one additional conductor connecting the first and second conductors to form the loop antenna;
an RFIC element including first and second input/output terminals connected to the first and second conductors of the loop antenna, respectively;
a resin block disposed above the first principal surface of the board and sealing the RFIC element and at least the first and second conductors of the loop antenna; and
a connection conductor extending through the board to connect the second conductor of the loop antenna to the flat plate-shaped conductor.

17. The wireless communication device according to claim 16, wherein the at least one additional conductor comprises:
a third conductor extending from the first conductor in an orthogonal direction away from the board,
a fourth conductor extending from the second conductor portion in the orthogonal direction away from the board, and
a fifth conductor that connects the third and fourth conductors, with the fifth conduct disposed on a surface of the resin block.

18. The wireless communication device according to claim 17,
wherein the third and fourth conductors comprise metal pins extending from the first principal surface of the board, and
wherein the RFIC element is disposed between the third and fourth conductors.

19. An article comprising:
a metal surface; and
a wireless communication device configured to be attached to the metal surface,
wherein the wireless communication device includes:
a flat plate-shaped conductor that faces the metal surface when the wireless communication device is attached to the metal surface,
an RFIC element including first and second input/output terminals,
a loop antenna having first and second ends connected to the first and second input/output terminals, respectively, and
a connection conductor that connects the loop antenna to the flat plate-shaped conductor,
wherein the loop antenna includes:
a first conductor disposed along the flat plate-shaped conductor and connected to the first input/output terminal,
a second conductor disposed along the flat plate-shaped conductor and connected to the second input/output terminal,
a third conductor extending from the first conductor in a direction away from the flat plate-shaped conductor,
a fourth conductor extending from the second conductor in the direction away from the flat plate-shaped conductor, and
a fifth conductor connecting the third and fourth conductors, and
wherein the connection conductor connects the second conductor of the loop antenna to the flat plate-shaped conductor.

20. The article according to claim 19, wherein the flat plate-shaped conductor and the metal surface are electrically connected via a capacitance or through a direct current.

* * * * *